US006797964B2

(12) United States Patent
Yamashita

(10) Patent No.: US 6,797,964 B2
(45) Date of Patent: Sep. 28, 2004

(54) ION SOURCE AND OPERATION METHOD THEREOF

(75) Inventor: Takatoshi Yamashita, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 160 days.

(21) Appl. No.: 09/773,664

(22) Filed: Feb. 2, 2001

(65) Prior Publication Data

US 2001/0017353 A1 Aug. 30, 2001

(30) Foreign Application Priority Data

Feb. 25, 2000 (JP) ..................................... P.2000-048470

(51) Int. Cl.[7] ................................................ H01J 37/08

(52) U.S. Cl. ................... 250/423 R; 250/424; 250/427; 250/492.3; 315/111.21; 315/111.41; 315/111.81

(58) Field of Search ........................... 315/5.14, 111.21, 315/111.41, 111.81, 111.91; 427/528; 250/492.21, 424, 427, 423 R, 492.3, 492.1, 492.2

(56) References Cited

U.S. PATENT DOCUMENTS 4,743,804 A * 5/1988 Frost et al. ................ 315/5.14
4,754,200 A * 6/1988 Plumb et al. ........... 315/111.81
5,079,481 A * 1/1992 Moslehi ................. 315/111.41
5,097,179 A 3/1992 Takayama
5,300,785 A * 4/1994 Aitken .................... 250/492.2
5,455,081 A * 10/1995 Okada et al. ............... 427/528
5,554,852 A * 9/1996 Bright et al. .......... 250/492.21
5,886,355 A 3/1999 Bright et al.
5,977,552 A * 11/1999 Foad ..................... 250/492.21
6,037,717 A * 3/2000 Maishev et al. ........ 315/111.91
6,151,384 A * 11/2000 Reed et al. ................. 378/138
6,335,534 B1 * 1/2002 Suguro et al. ......... 250/492.21

FOREIGN PATENT DOCUMENTS

JP 11-339674 12/1999

* cited by examiner

*Primary Examiner*—Nikita Wells
*Assistant Examiner*—Mary El-Shammaa
(74) *Attorney, Agent, or Firm*—Finnegan, Henderson, Farabow, Garrett & Dunner, L.L.P.

(57) ABSTRACT

This ion source is set up to satisfy a relation $$L<3.37B^{-1}\sqrt{(V_A)}\times 10^{-6}$$

where the arc voltage applied between a plasma production vessel 2 and a filament 8 is $V_A$[V], the magnetic flux density of a magnetic field 19 within the plasma production vessel 2 is B[T], and the shortest distance from a most frequent electron emission point 9 located almost at the tip center of the filament 8 to a wall face of the plasma production vessel 2 is L[m].

6 Claims, 4 Drawing Sheets

ION SOURCE AND OPERATION METHOD THEREOF

BACKGROUND OF THE INVENTION

1. Field of the Invention

The present invention relates to an ion source of the so-called Bernus type having a structure in which a filament and a reflector are provided within a plasma production vessel and a magnetic field is applied in a direction of connecting the filament and the reflector, and operation method applying the ion source, and more particularly to a device which enhances the ratio of molecular ions in an ion beam.

2. Description of the Related Art

One example of the ion source of this kind was disclosed in Japanese Patent Unexamined Publication No. Hei. 11-339674(JP-A-11-339674), for example. This will be described below with reference to FIGS. 3 and 4.

This ion source comprises a plasma production vessel 2 into which an ion source gas is introduced from a gas inlet opening 6 serving as an anode, a U-character shaped filament 8 provided through a wall face of the plasma production vessel 2 on one side of this plasma production vessel 2, and a reflector 10 (reflecting electrode) provided opposite the filament 8 on the other side of the plasma production vessel 2. Reference numerals 24 and 30 denote insulators.

On the wall face of the plasma production vessel 2, a long ion lead-out slit 4 is provided in a direction of connecting the filament 8 to the reflector 10. In a vicinity of an exit of this ion lead-out slit 4, a lead-out electrode 14 is provided to lead out an ion beam 16 from within the plasma production vessel 2 (more specifically from a plasma 12 produced therein).

Outside the plasma production vessel 2, a magnet 18 is provided to generate a magnetic field 19 in a direction of connecting the filament 8 to the reflector 10 within the plasma production vessel 2. The magnet 18 is an electromagnet, for example, but may be a permanent magnet. The magnetic field 19 may be an inverse direction to that as shown in the figure.

The orientation of the filament 8 is indicated as a matter of convenience to clarify the connection with a filament power source 20 in FIG. 3. In practice, a face containing the filament 8 bent like the U-character is arranged to be substantially parallel to the ion lead-out slit 4, as shown in FIG. 4.

The filament power source 20 for heating the filament 8 is connected to both sides of the filament 8. Between one end of the filament 8 and the plasma production vessel 2, an arc power source 22 is connected to apply an arc voltage $V_A$ between the filament 8 and the plasma production vessel 2, causing an arc discharge between them, and ionizing an ion source gas to produce a plasma 12.

The reflector 10 acts to reflect an electron emitted from the filament 8, and may be kept at a floating potential without connecting anywhere as in an illustrated example, or at a filament potential by connecting to the filament 8. If such reflector 10 is provided, an electron emitted from the filament 8, under the influence of a magnetic field 19 applied within the plasma production vessel 2 and an electric field of the arc voltage $V_A$, is reciprocating between the filament 8 and the reflector 10, while revolving in the magnetic field 19 around an axis in the direction of the magnetic field 19. As a result, the probability of collision of the electron with a gas molecule is increased to cause the ionization efficiency of the ion source gas to be enhanced, thus resulting in the higher production efficiency of the plasma 12.

Conventionally, in order to enhance the production efficiency of the plasma 12 by increasing the life of an electron emitted from the filament 8 till collision against the wall face of the plasma production vessel 2, it is common that the magnetic flux density B of the magnetic field 19 within the plasma production vessel 2 is set up so that the Larmor radius R (see Numerical Expression 2 as will be described later) of the electron in the magnetic field 19 is smaller than the shortest distance L from the most frequent emission point 9 located almost at the tip center of the filament 8 to the wall face of the plasma production vessel 2.

SUMMARY OF THE INVENTION

As shown in FIG. 1, an ion beam 16 led out of the ion source contains a molecular ion (e.g., $P_2^+$, $As_2^+$), which is an ion like a molecule, besides a monatomic ion (e.g., $P^+$, $As^+$). The molecular ions include, for example, a diatomic ion composed of two atoms, and a triatomic ion composed of three atoms.

The molecular ion has the following advantages over the monoatomic ion. Namely, (1) the molecular ion has enhanced transport efficiency because of less divergence than the monoatomic ion, (2) because when the molecular ion is implanted into a target, a plurality of atoms are implanted, the implantation amount (dose amount) can be obtained almost multiple times that of the monoatomic ion in the case of a same beam current, and (3) on the contrary, in the case of a same implantation amount, the molecular ion has a less beam current, thus a smaller amount of charges incident on the target, than the monoatomic ion, whereby it is expected that there is the effect of suppressing the charge-up (charging) of the target.

From such a point of view, it is preferable that the ratio of molecular ions in an ion beam is higher. Thus, it is an object of this invention to enhance the ratio of molecular ions in an ion beam.

An ion source according to this invention is set up such that supposing that the arc voltage applied between the plasma production vessel and the filament is $V_A$[V], the magnetic flux density of the magnetic field within the plasma production vessel is B[T], and the shortest distance from a most frequent electron emission point located almost at the tip center of the filament to the wall face of the plasma production vessel is L[m], a relation of the following expression (1) is satisfied.

$$L<3.37B^{-1}\sqrt{(V_A)}\times10^{-6} \quad (1)$$

An operation method of an ion source according to this invention is set up to lead out an ion beam such that supposing that the arc voltage applied between said plasma production vessel and said filament is $V_A$[V], the magnetic flux density of the magnetic field within said plasma production vessel is B[T], and the shortest distance from a most frequent electron emission point located almost at the tip center of said filament to the wall face of the plasma production vessel is L[m], the above-described expression 1 is satisfied.

Various physical collisions, molecular dissociation, or chemical reactions of electrons, ions, atoms, and molecules occur inside a plasma produced within the plasma production vessel, constantly repeating the production and disappearance of molecular ions. To prevent the produced molecular ions from being dissociated, it is effective to decrease the probability of existence of electrons having energy over several electron volts.

The Larmor radius R of electrons emitted from the filament revolving in the magnetic field within the plasma production vessel can be represented in the following expression (2). Where B and $V_A$ are as mentioned previously, m is a mass of electron, and e is a quantum of electricity.

$$R=B^{-1}\sqrt{(2mV_A/e)}\approx 3.37B^{-1}\sqrt{(V_A)}\times 10^{-6}[m] \quad (2)$$

That is, the right side of the expression 1 represents the Larmor radius R of this electron, whereby the expression 1 can be written as L<R. If such a condition is set up, the probability that an electron having a high energy collides against the wall face of the plasma production vessel and quenches is increased, making it possible to shorten the life (existence probability) of electrons having high energy, whereby the ratio of molecular ions in a plasma can be enhanced, as described above. As a result, the ratio of molecular ions in an ion beam can be enhanced.

DETAILED DESCRIPTION OF THE PREFERED EMBODIMENT

Figure 1:
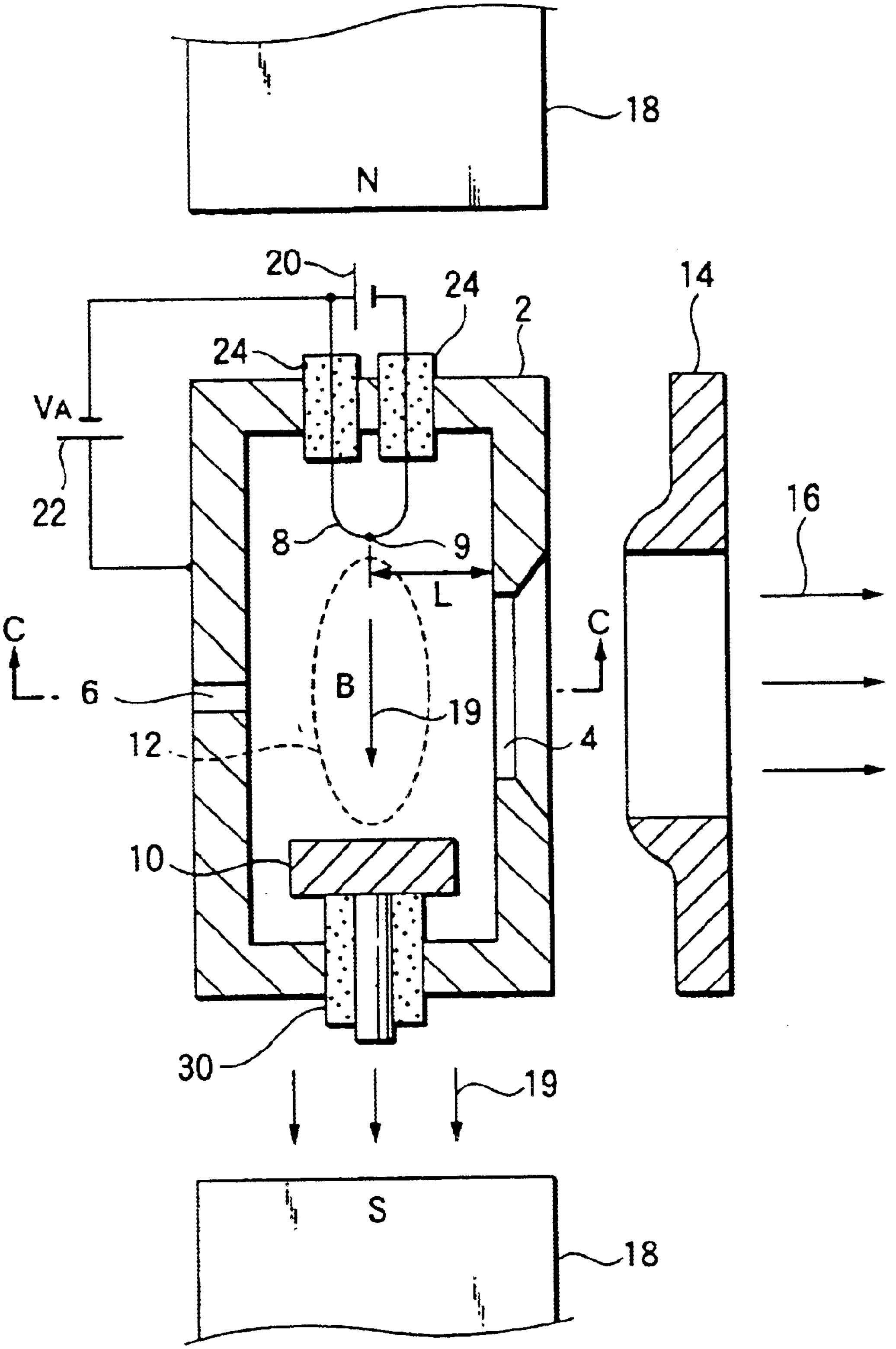
FIG. 1 is a cross-sectional view illustrating an example of an ion source according to this invention.

FIG. 1 is a cross-sectional view illustrating an example of an ion source according to this invention. The same or like parts are indicated by the same numerals as in FIGS. 1, 3 and 4. Therefore, the different points from the conventional example will be principally described below.

Figure 3:
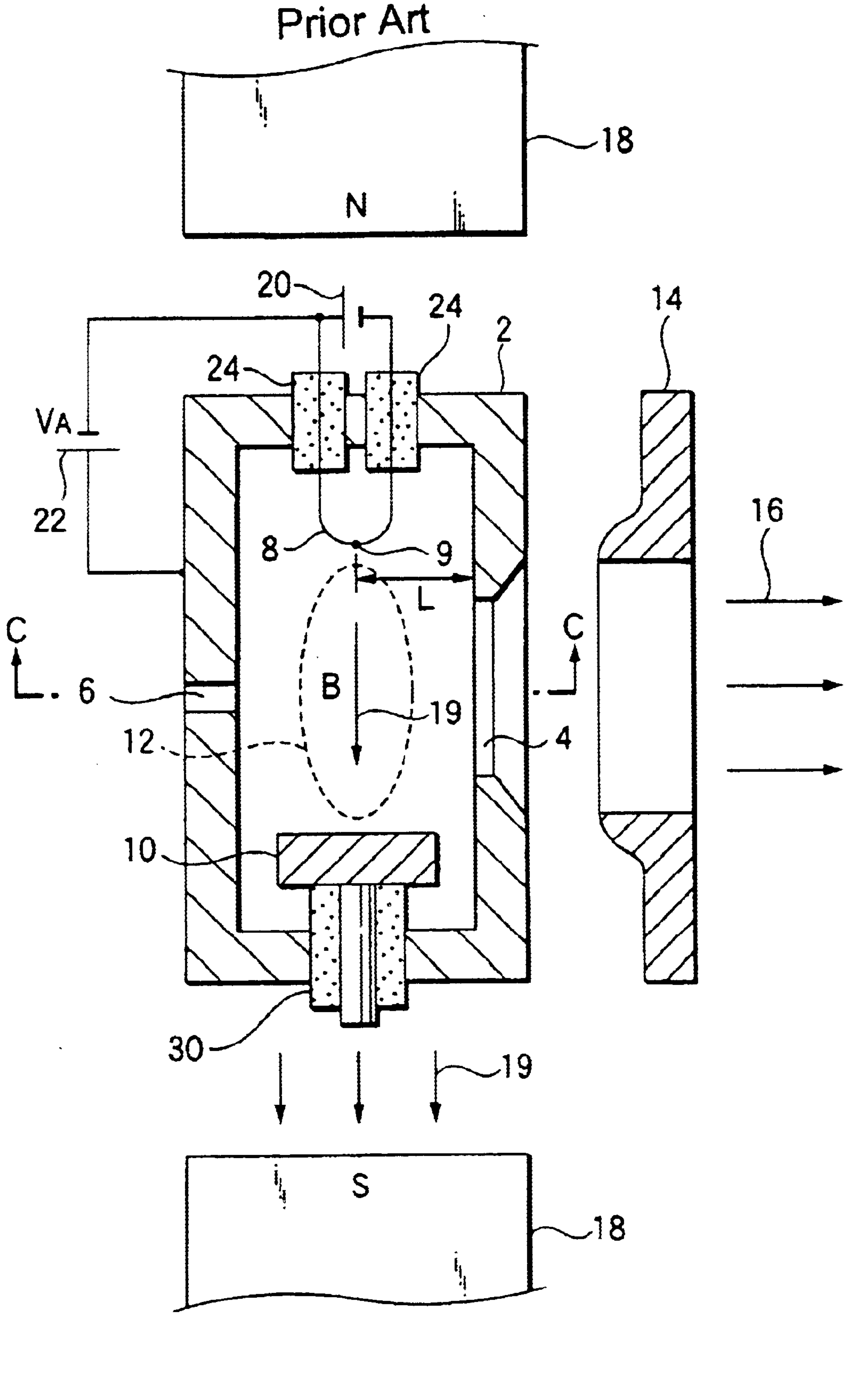
FIG.3 Prior Art
FIG. 3 is a cross-sectional view illustrating an example of the conventional ion source.
Figure 4:
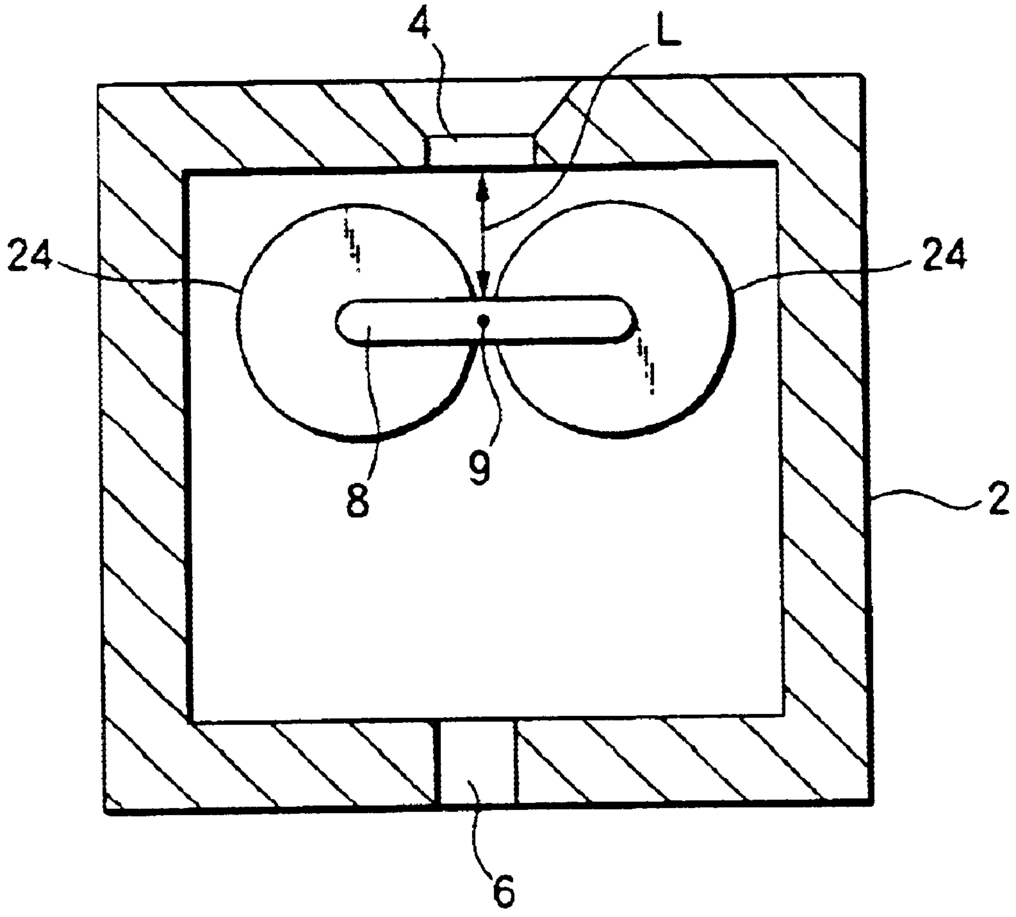
FIG. 4 is a cross-sectional view illustrating an example of arranging a filament within the plasma production vessel, corresponding to the cross section C—C of FIGS. 1 and 3.

Though a basic structure of this ion source is the same as that of the conventional example of FIG. 3, this ion source is set up such that the above relation of the expression (1) is satisfied for $V_A$, B and L, supposing that the arc voltage applied from an arc power source 22 between a plasma production vessel 2 and a filament 8 is $V_A$[V], the magnetic flux density of a magnetic field 19 within the plasma production vessel 2 due to a magnet 18 is B[T], and the shortest distance from a most frequent electron emission point 9 located almost at the tip center of the filament 8 to a wall face of the plasma production vessel 2 is L[m]. This point is considerably different from the conventional example of FIG. 3.

In other words, when this ion source is driven, an ion beam 16 is led out by setting $V_A$, B and L to satisfy the above relation of the expression (1).

The most frequent electron emission point 9 is located almost at the tip center of the U-character shaped filament 8, because it is at the highest temperature there. However, the emission of electrons from the filament 8 involves the emission of electrons caused by ion sputtering in a plasma 12, in addition to the thermionic emission of electrons. The thermionic emission of electrons occurs most frequently at the tip center of the filament 8 which reaches the highest temperature. The emission of electrons by sputtering occurs most frequently at a position slightly dislocated to the cathode side of a filament power source 20 from the tip center of the filament 8 due to the influence of a filament voltage from the filament power source 20. Under such influence, the most frequent electron emission point 9 may be dislocated slightly (e.g., about several mm) to the cathode side from the tip center of the filament 8. In this specification, it is said that the most frequent electron emission point 9 occurs in the vicinity of the tip center of the filament 8, including this instance.

Specific means for satisfying the above relation of the expression 1 may adjust the magnetic flux density B, for example. If the magnet 18 is configured by an electromagnet, for example, this adjustment can be easily effected.

In the case that the above relation of the expression (1) is satisfied, the Larmor radius R of electrons is larger than the shortest distance L, whereby the probability that the electrons having high energy over several eV collide against the wall face of the plasma production vessel 2 and disappear is increased. Therefore, the life of electrons having high energy can be reduced, so that the ratio of molecular ions in the plasma 12 can be enhanced, as described above. As a result, the ratio of molecular ions in the ion beam 16 can be enhanced. Moreover, when the molecular ions are utilized, this is beneficial in making effective use of the above-cited advantages: (1) improved transport efficiency, (2) increased actual implantation amount, and (3) suppression of charge-up.

With the above relation, though there is the possibility that the total production efficiency of plasma 12 is decreased and the total amount of ion beam 16 is decreased, this can be compensated by increasing the input power into the plasma 12 such as by increasing the filament current. In this way, the total amount of ion beam 16 can be increased. In this case, according to this invention, the ratio of molecular ions in the ion beam 16 can be enhanced, so that more molecular ions can be obtained.

Figure 2:
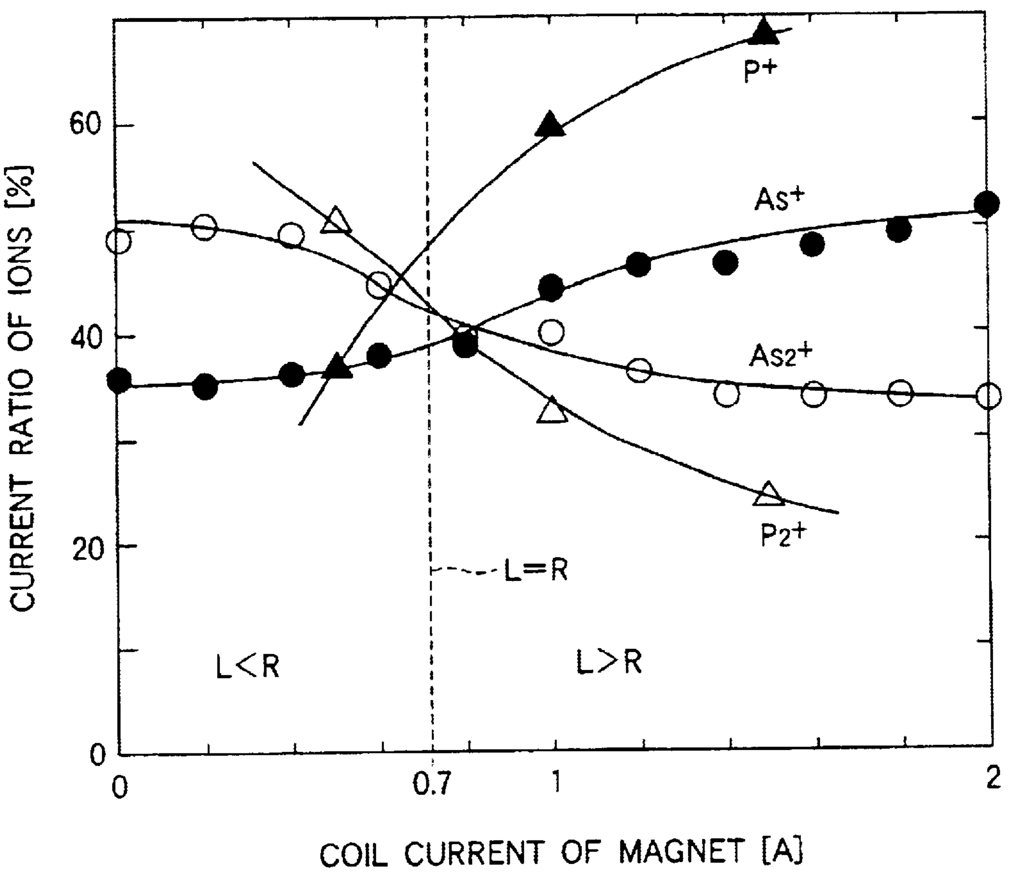
FIG. 2 shows an example of the results of measuring the current ratio of notable ions in an ion beam when the magnetic flux density within a plasma production vessel is varied by changing the coil current of a magnet.

FIG. 2 shows an example of the results of measuring the current ratio of notable ions in the ion beam 16 when the magnet 18 is an electromagnet, and the magnetic flux density B within the plasma production vessel 2 is varied by changing the coil current. The ion current ratio in the longitudinal axis signifies the ratio of the notable ion current to the total beam current.

In the same figure, a triangular sign indicates an example of introducing $PH_3$ as an ion source gas into the plasma production vessel 2 to lead out the ion beam 16 containing phosphorus ions. A round sign indicates an example of introducing $AsH_3$ to lead out the ion beam 16 containing arsenic ions.

Conventionally, an area L>R was employed, as previously described. However, according to this invention, an area L<R is employed, so that the ratio of bimolecular ions ($P_2^+$, $As_2^+$) can be more increased as compared with the conventional one. The same ratio reaches its maximum value of near 50%.

As described above, with this invention, if the above relation is satisfied, the probability that the electrons having high energy collide against the wall face of the plasma production vessel and quench is increased. Hence, the life of electrons having high energy can be reduced, so that the ratio of molecular ions in the plasma can be enhanced. Consequently, the ratio of molecular ions in the ion beam can be enhanced. Moreover, when the molecular ion is utilized, this is beneficial in making effective use of the advantages: (1) improved transport efficiency, (2) increased actual implantation amount, and (3) suppression of charge-up.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. An ion source comprising:

a plasma production vessel which serves as an anode;

a filament provided on one side of said plasma production vessel;

a reflector provided opposite said filament on the other side of said plasma production vessel and kept at a filament potential or a floating potential; and a magnet for generating a magnetic field in a direction of connecting said filament and said reflector within said plasma production vessel, wherein a relation $$L<3.37B^{-1}\surd(V_A)\times10^{-6}$$

is satisfied, where the arc voltage applied between said plasma production vessel and said filament is $V_A$[V], the magnetic flux density of the magnetic field within said plasma production vessel is B[T], and the shortest distance from a most frequent electron emission point located almost at the tip center of said filament to a wall face of the plasma production vessel is L[m], wherein the magnetic field is configured to cause electrons produced by the plasma production vessel above an energy level to collide with the wall face.

2. The ion source according to claim 1, wherein the ion source is a Bernus type.

3. The ion source according to claim 1, wherein said magnet is an electromagnet or a permanent magnet.

4. A method for operating an ion source which comprises a plasma production vessel serving as an anode, a filament provided on one side of said plasma production vessel, a reflector provided opposite said filament on the other side of said plasma production vessel and kept at a filament potential or a floating potential, and a magnet for generating a magnetic field in a direction of connecting said filament and said reflector within said plasma production vessel, the method comprising a step of leading out an ion beam with the following relation being satisfied, $$L<3.37B^{-1}\surd(V_A)\times10^{-6}$$

where an arc voltage applied between said plasma production vessel and said filament is $V_A$[V], a magnetic flux density of the magnetic field within said plasma production vessel is B[T], and a shortest distance from a most frequent electron emission point located almost at the tip center of said filament to a wall face of said plasma production vessel is L[m], wherein the magnetic field is configured to cause electrons produced by the plasma production vessel above an enemy level to collide with the wall face.

5. The method according to claim 4, wherein the ion source is a Bernus type.

6. The method according to claim 4, wherein said magnet is an electromagnet or a permanent magnet.

* * * * *

UNITED STATES PATENT AND TRADEMARK OFFICE

CERTIFICATE OF CORRECTION

PATENT NO. : 6,797,964 B2
DATED : September 28, 2004
INVENTOR(S) : Takatoshi Yamashita It is certified that error appears in the above-identified patent and that said Letters Patent is hereby corrected as shown below:

Column 6,
Line 26, "enemy" should read -- energy --.

Signed and Sealed this

Eighteenth Day of January, 2005

JON W. DUDAS
*Director of the United States Patent and Trademark Office*